(12) United States Patent
De Flaviis

(10) Patent No.: US 6,891,448 B2
(45) Date of Patent: May 10, 2005

(54) COMPACT BALUN FOR 802.11A APPLICATIONS

(75) Inventor: Franco De Flaviis, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 150 days.

(21) Appl. No.: 10/232,620

(22) Filed: Sep. 3, 2002

(65) Prior Publication Data

US 2004/0041650 A1 Mar. 4, 2004

(51) Int. Cl.[7] .............................................. H01P 5/10
(52) U.S. Cl. ....................................... 333/26; 333/116
(58) Field of Search .............................. 333/25, 26, 27, 333/116, 109, 112, 115

(56) References Cited

U.S. PATENT DOCUMENTS

| | | | | |
|---|---|---|---|---|
| 5,455,545 A | * | 10/1995 | Garcia | 333/26 |
| 6,018,277 A | * | 1/2000 | Vaisanen | 333/26 |
| 6,515,556 B1 | * | 2/2003 | Kato et al. | 333/116 |

FOREIGN PATENT DOCUMENTS

| | | | | |
|---|---|---|---|---|
| EP | 2144985 | 3/1973 | | H01P/5/12 |

OTHER PUBLICATIONS

Piernas B. et al., "Improvement of the Design of 180 DEG Rat-Race Hybrid", Electronics Letters, GB, vol. 36, No. 12, pp. 1035–1036 (Jun. 2000).

Settaluri Raghu K. et al., "Compact Folded Line Rat-Race Hybrid Couplers", IEEE Microwave Guided Wave Lett; IEEE Translations on Microwave and Guided Wave Letters, Feb. 2000, IEEE, vol. 10, No. 2, pp. 61–63.

Settaluri R. K. et al., "Design of Compact Multi-Level Folded-Line RF Couplers", 1999 IEEE MTT-S International Microwave Symposium Digest, IEEE Transactions on Microwave Theory and Techniques, vol. 47, No. 12, pp. 2331–2339 (Dec. 1999).

Copy of European Search Report issued Jan. 13, 2004 for Appl. No. EP/03019915, 4 pages.

* cited by examiner

Primary Examiner—Robert Pascal
Assistant Examiner—Dean Takaoka
(74) Attorney, Agent, or Firm—Sterne, Kessler, Goldstein & Fox, PLLC

(57) ABSTRACT

A balancing/unbalancing (balun) structure includes a microstrip line printed circuit board (PCB). Two input ports are coupled to a differential signal. An isolated port is connected to ground through a resistance. An output port is coupled to a single-ended signal corresponding to the differential signal. A plurality of traces on the PCB connect the two input ports, the load connection port and the output port, wherein distance between adjacent traces is approximately twice PCB thickness.

17 Claims, 13 Drawing Sheets fase=phase(S(2,1))-phase(S(4,1))

fase=phase(S(2,1))-phase(S(4,1))

COMPACT BALUN FOR 802.11A APPLICATIONS

CROSS-REFERENCE TO RELATED APPLICATIONS

This application is related to U.S. patent application No. 10/232,617, filed on Sep. 3, 2002, entitled COMPACT BALUN WITH REJECTION FILTER FOR 802.1 1a AND 802.1 1b SIMULTANEOUS OPERATION, Inventor: Franco De Flaviis, which is incorporated by reference herein.

BACKGROUND OF THE INVENTION

1. Field of the Invention

The present invention is related to balancing/unbalancing structures, or "baluns," for use in gigahertz wireless applications.

2. Related Art

A balun (short for BALanced to Unbalanced) is a transformer connected between a balanced source or load (signal line) and an unbalanced source or load (signal line). A balanced line has two signal line conductors, with equal currents in opposite directions. The unbalanced signal line has just one conductor; the current in it returns via a common ground or earth path. Typically, an RF balun function is implemented as an off-chip transformer or as a quarter wave hybrid (lumped or microstrip) integrated into an RF circuit board.

RF wireless circuits utilize balanced outputs of signals to minimize the effect of ground inductance and to improve common mode rejection. Circuits that benefit from balanced operation include mixers, modulators, IF strips, differential amplifiers and voltage controlled oscillators. These balanced outputs, moreover, consist of differential signals which must be combined to provide a single ended output signal. Thus, a balun is a RF balancing network or electric circuit for coupling an unbalanced line or device and a balanced line or device for the purpose of transforming from balanced to unbalanced or from unbalanced to balanced operation, with minimum transmission losses. A balun can be used with an unbalanced input and a pair of balanced outputs or, in the reverse situation, a pair of balanced sources and an unbalanced load. Baluns can be used to interface an unbalanced input with a balanced circuit by dividing the signal received at its unbalanced terminal equally to two balanced terminals, and by providing the signal at one balanced terminal with a reference phase and the signal at the other balanced terminal with a phase that is 180° out-of-phase relative to the reference phase. Plus or minus 180° baluns can be used to interface a balanced or differential input from a balanced port of a balanced circuit providing output signals which are equal in magnitude but 180° out-of-phase and an unbalanced load driven by a single-ended input signal. The balun combines the signals of the balanced input and provides the combined signal at an another port.

The balanced structure can improve performance in devices such as mixers, modulators, attenuators, switches and differential amplifiers, since balanced circuits can provide better circuit-to-circuit isolation, dynamic range, and noise and spurious signal cancellation. A balanced load is defined as a circuit whose behavior is unaffected by reversing the polarity of the power delivered thereto. A balanced load presents the same impedance with respect to ground, at both ends or terminals. A balanced load is required at the end of a balanced structure to ensure that the signals at the balanced port will be equal and opposite in phase.

Depending on the implementation, baluns can be divided into two groups: active and passive. Active baluns are constructed by using several transistors (so-called active devices). Although active baluns are very small, they are not generally preferred for the following reasons. First, due to the employment of active devices, noise will be introduced into the system. Also, active devices tend inherently to waste power. Additionally, the low-cost fabrication of active baluns is limited to semiconductor manufacture. Conversely, passive baluns are quite popular. Passive baluns include lumped-type baluns and distributed-type baluns.

Lumped-element-type baluns employ discrete components that are electrically connected, such as lumped element capacitors and lumped element inductors. Advantages of lumped-element-type baluns include small size and suitability for low frequency range usage. On the other hand, the performance of lumped-element-type baluns is not good in high frequency ranges (several GHz), because the lumped elements are very lossy and difficult to control. Also, the operational bandwidth of lumped-element-type baluns is small (<10%, typically).

A 180° hybrid device is constructed from several sections of quarter-wavelength transmission lines and a section of half-wavelength transmission line. The drawbacks of the 180° hybrid device are larger size, difficulty in achieving a high impedance transformation ratio, and limitation to a balanced pair of unbalanced outputs.

In general, low return loss, low insertion loss, and good balanced characteristics are required for balun applications. In addition, bandwidth is another figure of merit.

An example of a conventional 180° hybrid is shown in FIG. 1, which shows four hybrids, all of which have a rat-race arrangement. The hybrids are suitable for 5.3 GHz operation, and a single hybrid is shown in FIG. 2, along with representative dimensions. As may be seen from FIG. 2, the footprint of each hybrid is approximately 473 mm$^2$ (18.2×26 mm), including the feeding arms, and the overall size of the board in FIG. 1, which includes the four hybrids, is about 2916 mm$^2$ (54×54 mm). As shown in FIG. 3, the hybrid of FIGS. 1 and 2 may be thought of as a 3-port microwave device, with an input port, and two output ports, one of which outputs the signal with a phase of 0° at −3 dB, and the other one outputs the signal at 180°, at −3 dB. It will be appreciated that for a passive device such as illustrated in FIGS. 1 and 2, the designation of "input" or "output" is purely arbitrary. In practical applications, the single-ended input (or output) may, for example, be connected to an antenna, while the differential output (or input) may be connected to a differential amplifier, or differential driver.

However, many of the known passive balun structures are relatively large, which is often unacceptable in modern wireless applications.

SUMMARY OF THE INVENTION

The present invention is directed to a compact balun for 802.11a applications that substantially obviates one or more of the problems and disadvantages of the related art.

There is provided a balancing/unbalancing (balun) structure including a microstrip line printed circuit board (PCB). Two input ports are coupled to a differential signal. An isolated port is connected to ground through a resistance. An output port for coupling to a single-ended signal corresponding to the differential signal. A plurality of traces on the PCB connects the two input ports, the load connection port and the output port, wherein distance between adjacent traces is approximately twice PCB thickness.

In another aspect there is provided a 180° hybrid balun including a microstrip line printed circuit board (PCB). Two input ports on one side of the balun are coupled to a differential signal. An isolated port is connected to ground through a resistance. An output port on an opposite side of the balun is coupled to a single-ended signal corresponding to the differential signal, a direction from the one side to the opposite side defining a horizontal axis. A plurality of traces on the PCB connect the two input ports, the load connection port and the output port. The plurality of traces includes a plurality of folded λ/4 elements oriented along the horizontal axis.

Additional features and advantages of the invention will be set forth in the description that follows, and in part will be apparent from the description, or may be learned by practice of the invention. The advantages of the invention will be realized and attained by the structure and without particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

Figure 4:
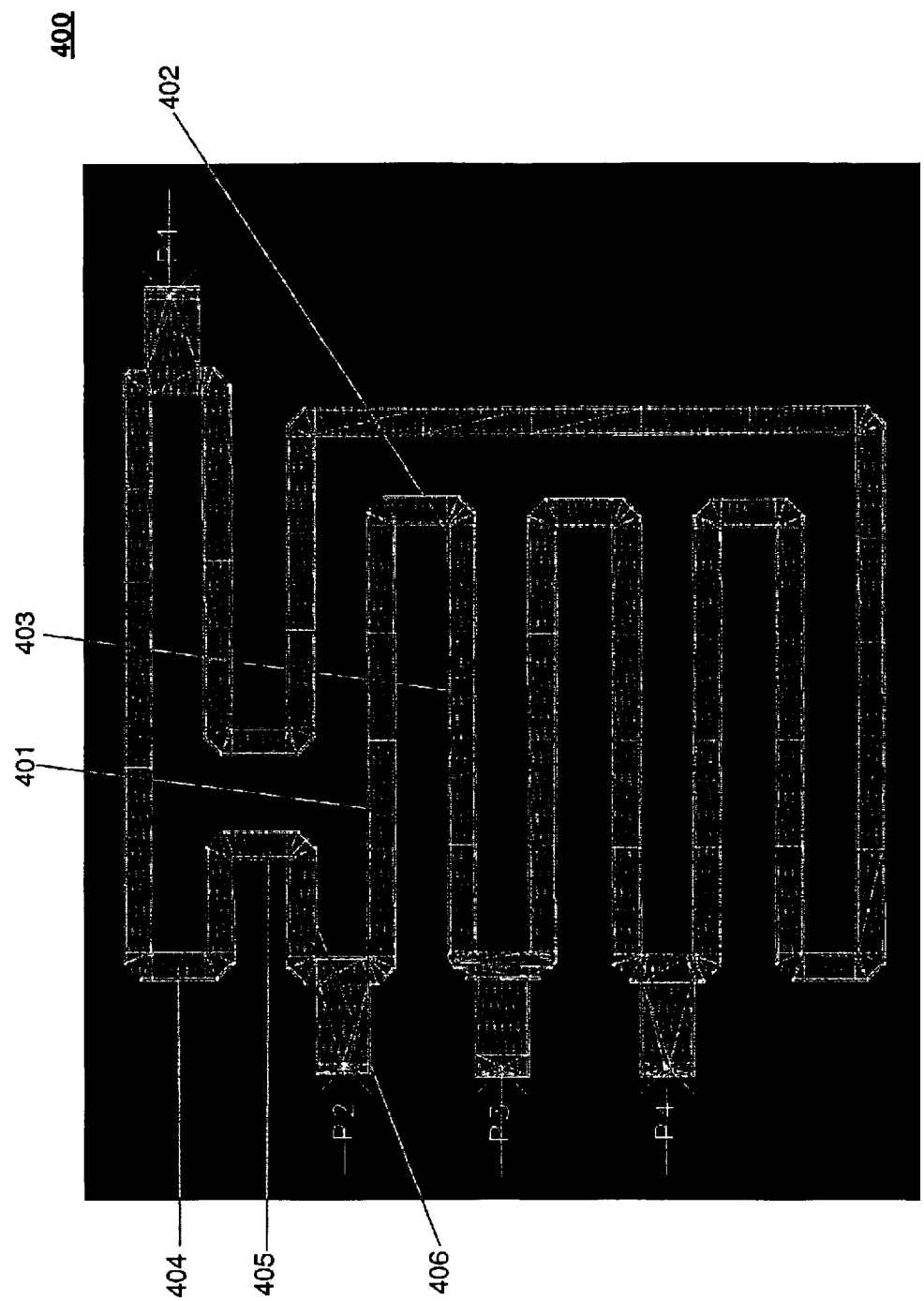
FIGS. 4 and 17 show a 180° hybrid balun of one embodiment of the present invention.

FIG. 4 illustrates one embodiment of a 180° hybrid balun 400 of the present invention. As shown in FIG. 4, the hybrid balun 400 has 4 ports, P1, P2, P3 and P4, and a number of traces (transmission lines) connecting the ports to each other. The differential signal is viewed at input ports P2 and P3, and is outputted at port P1. It will be appreciated that the designation of the ports as either "input" or "output" is arbitrary, and the balun 400, being a passive device, works identically in both directions.

For ease of reference, the hybrid in FIG. 4 may be said to have a horizontal direction from left to right, and vertical direction from top to bottom in the figure. It will, of course, be understood by one of ordinary skill in the art that such designations are purely nominal, and only serve to explain the illustrations of the embodiment (while having no particular significance in actual implementation on a circuit board).

Port P4 is connected to a ground through a matched resistance (for example, 50 ohms). The balun 400 shown in FIG. 4 has a "folded in on itself" topology, in other words, the amount of open space inside the balun 400 is kept to a minimum by folding the transmission lines inward. Specifically, all the adjacent traces are arranged such that the spacing between the traces is approximately double the thickness of the printed circuit board (PCB). Note that trying to bring the traces closer than that will likely result in unwanted cross-coupling, and degraded performance.

The transmission line distance between the port P2 and the port P1 is λ/4. The transmission line distance between the port P2 and the port P3 is λ/4. The transmission line distance between the port P3 and the port P4 is λ/4. The transmission line distance between the port P4 and the port P1 is 3λ/4.

The embodiment illustrated in FIG. 4 has the following characteristics:

| | |
|---|---|
| Center frequency of operation | $f_0$ = 5.3 GHz |
| Bandwidth | BW = 0.15 GHz (0.3 dB roll off) |
| Substrate thickness | H = 0.2286 mm (top layer) |
| Relative dielectric constant | $\epsilon_r$ = 3.783 |
| Dielectric loss at 5.3 GHz | tanδ = 0.01 |
| Minimum line width | Δs = 0.127 mm |
| Substrate material: | FR-4 |

The hybrid shown in FIG. 4 has an approximately square shape. It will be appreciated that the shape is not necessarily a perfectly geometric square. However, generally, the closer that such a shape is to a square, the less overall area the hybrid takes up. It will also be appreciated that the hybrid of FIG. 4 may be "stretched" in either the vertical or horizontal dimension, to result in a more "rectangular" layout. Additionally, one of the advantages of the present invention is that a hybrid such as that shown in FIG. 4 may be modified to fit into "odd" shapes, to the extent such oddly shaped free areas are available on the printed circuit board.

Further with reference to FIG. 4, the hybrid balun 400 has a plurality of folded λ/4 elements formed by the traces. For example, one such element is formed by the traces designated 401, 402 and 403 in FIG. 4. This folded λ/4 element connects the port P2 and the port P3, and is oriented in a horizontal direction, or along a horizontal axis. Another such "folded element" is formed by the traces designated 404, 405 and 406, which is also oriented along the horizontal axis, but is shorter than the folded λ/4 element formed by the traces 401, 402 and 403. Thus, due to the use of the folded λ/4 elements, the entire balun 400 has a topology that is "folded in on itself," as discussed above, and the overall area occupied by the balun 400 is minimized. The corners of the folded λ/4 elements are shown as being at 45° in FIG. 4. In actual applications, the use of rounded corners may provide slightly better performance, but from a manufacturing standpoint, the use of 45° corners may be preferred.

Figure 1:
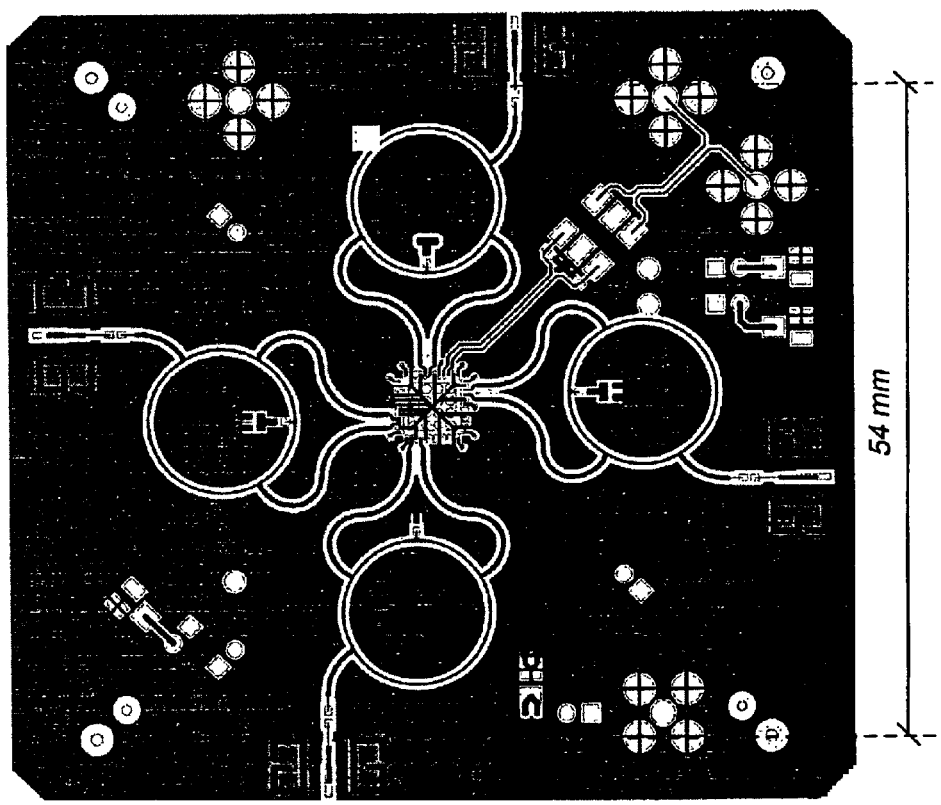
FIG. 1 shows an arrangement of four conventional 180° hybrid baluns of a rat race type for 5.3 GHz application.
Figure 2:
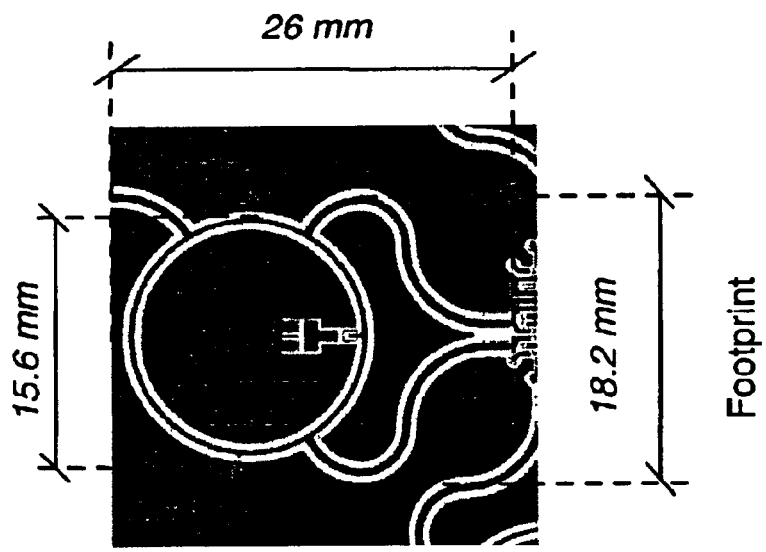
FIG. 2 shows a single rat race 180° hybrid balun.
Figure 3:
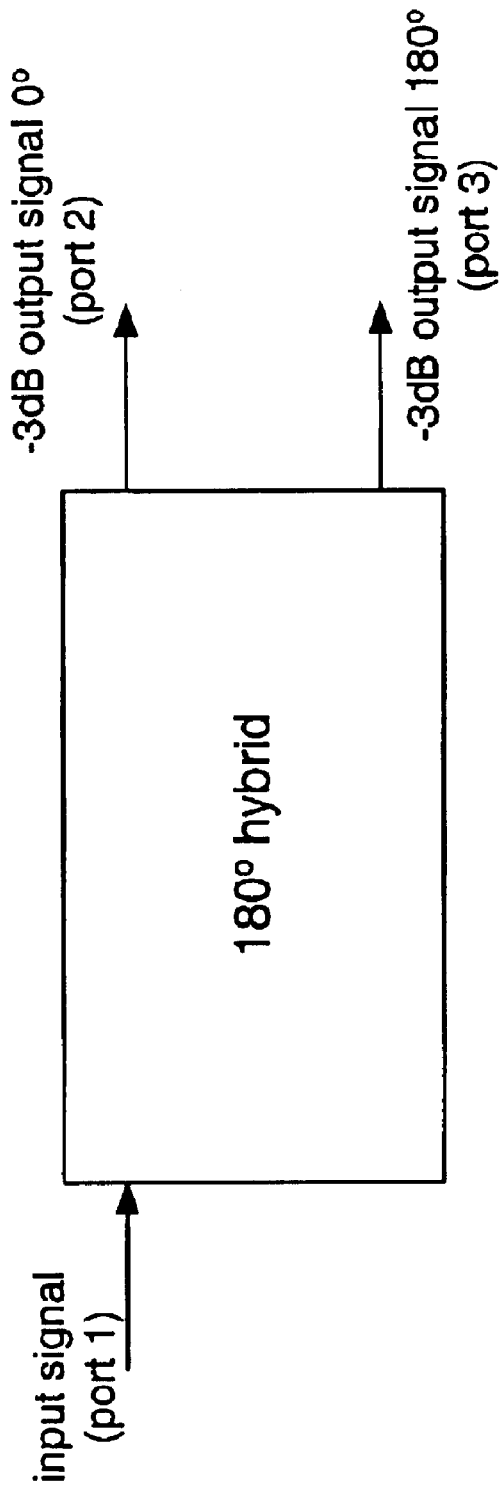
FIG. 3 shows a 180° hybrid balun as a 3-port microwave device.

Compared to the conventional balun illustrated in FIG. 2, the overall size of the balun 400 of this embodiment is reduced by a factor of 12 in the footprint area (from 473 mm² to 37 mm²). Also, the input ports P2, P3 are located on the same side. This avoids the need of long connecting arms thus reducing the insertion loss. The design is almost insensitive to the line width with nearly 60% tolerance, and is almost insensitive to the parasitics associated with the load on the isolated port P4.

Figure 17:
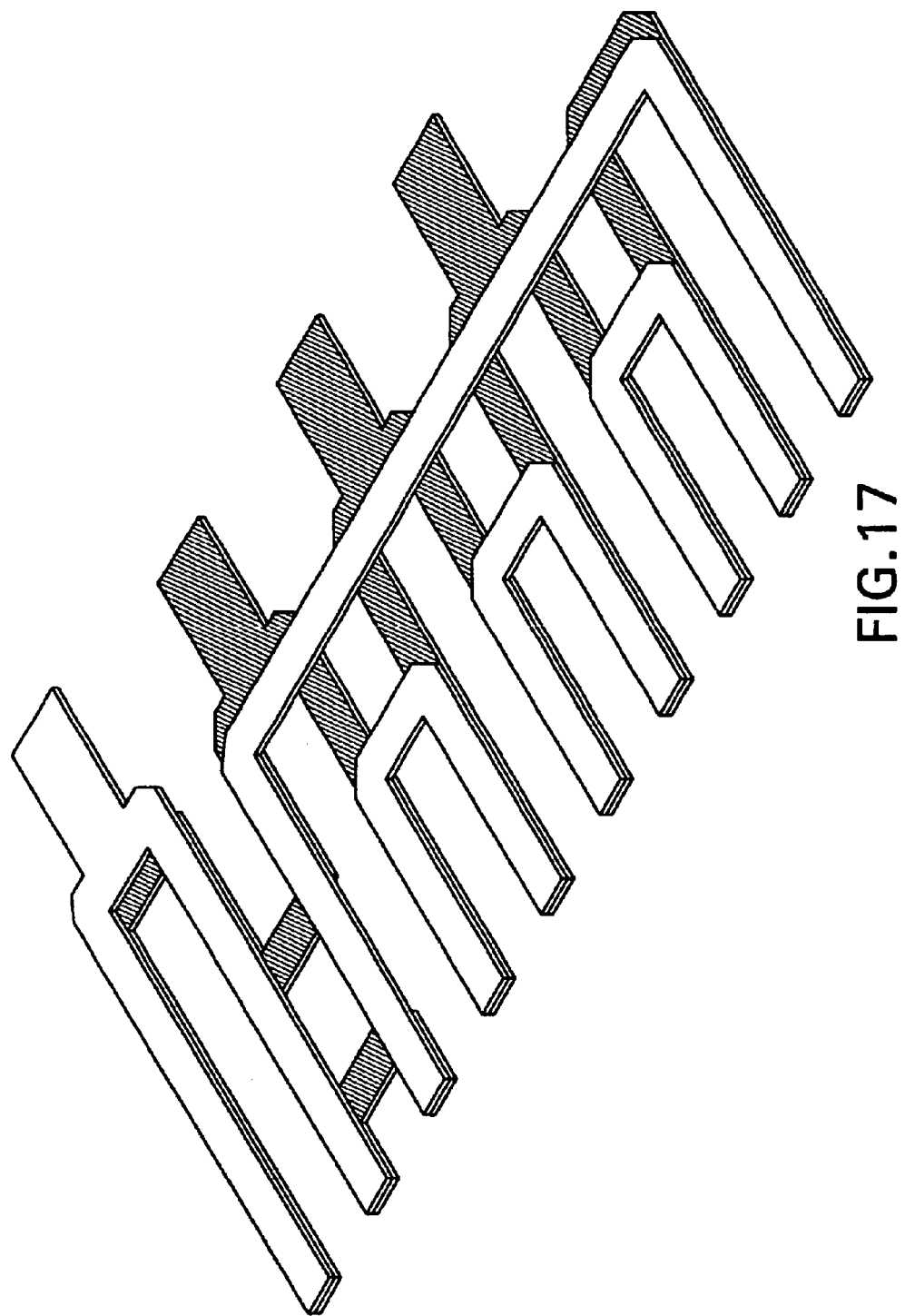

It will also be appreciated that the hybrid balun 400 shown in FIG. 4 may be manufactured on a single layer PCB, where the "bottom" of the PCB is grounded, and the traces shown in FIG. 4 are on the "top." If additional area reduction is required, the balun 400 of FIG. 4 may be folded further using a third layer of tracing (i.e., using a two-substrate PCB), where the middle tracing layer is ground, and the two halves of the "folded in" balun 400 of FIG. 4 are formed on opposite sides of the PCB (see FIG. 17 for an isometric view, with the around layer and the PCB material not shown). Such an arrangement, while reducing the area occupied by the balun 400, requires the addition of vias, which tends to increase parasitics, and reduce the bandwidth. Also, to the extent the space on the bottom of the two substrate PCB was available for use in placing other components, it would obviously not be available if it is used for the folded balun 400 as described above.

Figure 5:
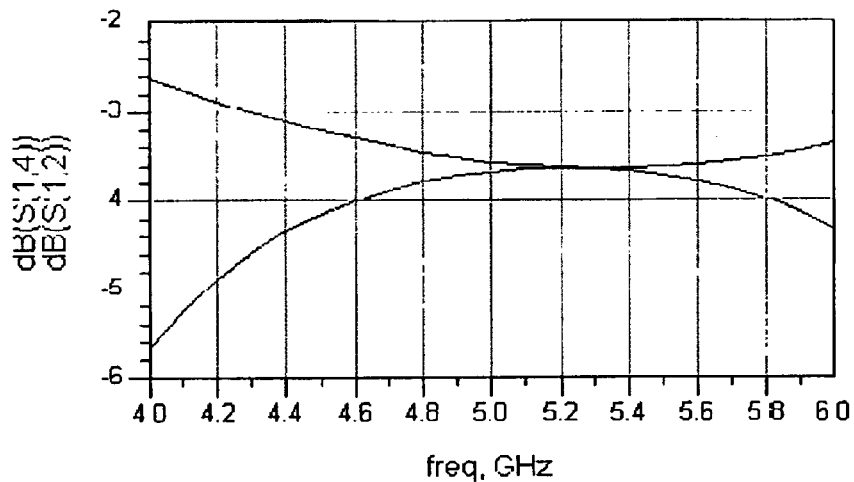
FIG. 5 shows scattering parameters $S_{14}$ and $S_{12}$ of the embodiment of FIG. 4.

FIG. 5 is an illustration of predicted S scattering parameters for transmission between the ports P1 and P4, and the ports P1 and P2 of the balun 400. As may be seen from FIG. 5, at the frequency of interest (here, 5.3 GHz), the scattering parameter is approximately −3 dB (or about −3.6 dB, as seen from FIG. 5). In other words, the predicted performance of the 180° hybrid balun 400 is what is required of a device such as this.

Figure 6:
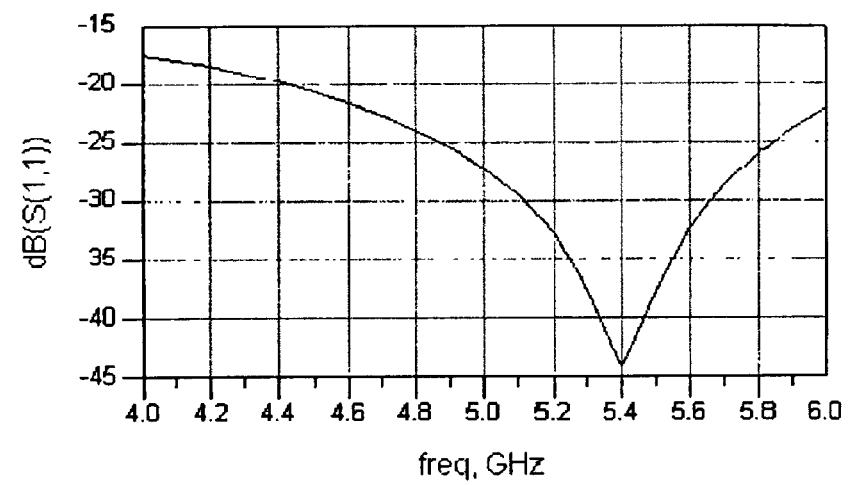
FIG. 6 shows the scattering parameter $S_{11}$ of the embodiment of FIG. 4.

FIG. 6 shows a predicted scattering parameter $S_{11}$ that represents whether the balun 400 is properly matched to the transmission characteristics of the printed circuit board. As may be seen from FIG. 6, the scattering parameter $S_{11}$ at all frequencies of interest is substantially less than −20 dB.

Figure 7:
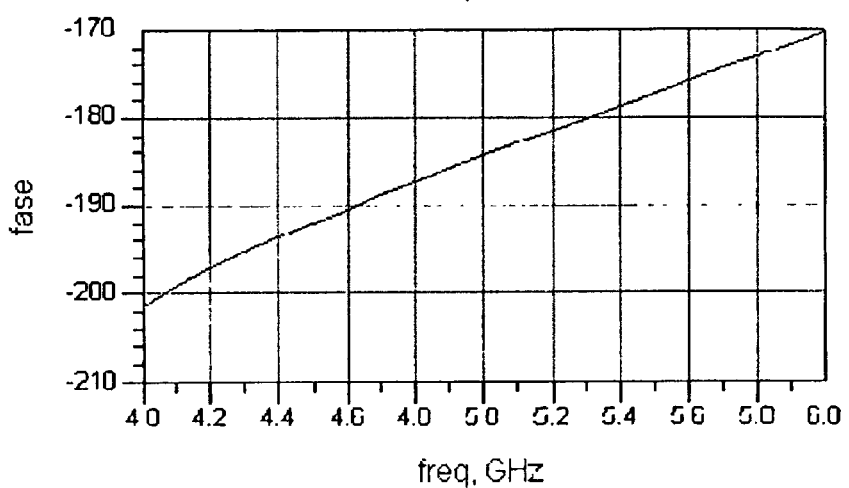
FIG. 7 shows the phase difference for signals passing through the balun of FIG. 4.

FIG. 7 shows a predicted phase response of the balun 400, specifically the phase of the transmitted signal from port P2 to port P1 minus the transmitted signal from port P4 to port P1. As may be seen from FIG. 7, the phase response at 5.3 GHz, the frequency of interest, is −180°, or exactly what is required.

One of the advantages of the topology of FIG. 4 is that the input ports P2 and P3 are on one side of the device, while the output port P1 is on the opposite side of the device. This often has an advantage in the layout of the PCB, particularly where a connection to an antenna at the port P1 is involved.

Figure 8:
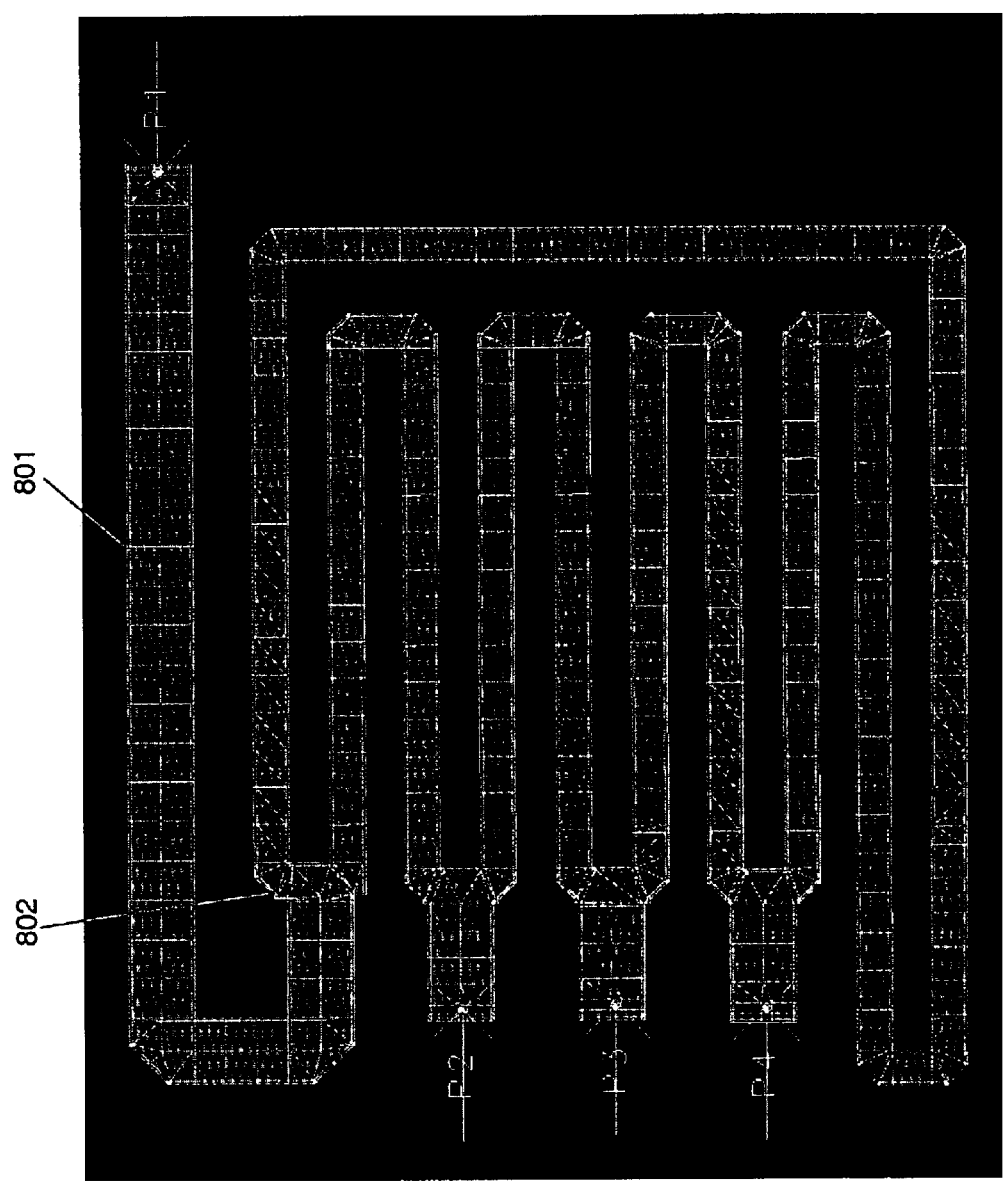
FIG. 8 shows another embodiment of a 180° of the present invention.

FIG. 8 illustrates another embodiment of a balun 800 of the present invention. As may be seen from FIG. 8, the balun 800 includes four ports P1, P2, P3, P4, similar to the embodiment of FIG. 4, as well as a plurality of folded λ/4 elements. The major difference is that the use of an extension 801, which connects to the balun 800 itself at point 802. This is done in order to have the differential inputs P2 and P3 on one side, and the single ended output P1 on the other. If having the inputs and the output of the balun 800 on the same side is acceptable, then there would obviously be no need for the extension 801.

It will also be appreciated that the structure shown in FIG. 8 includes the folded λ/4 elements, as described above with reference to FIG. 4.

Figure 9:
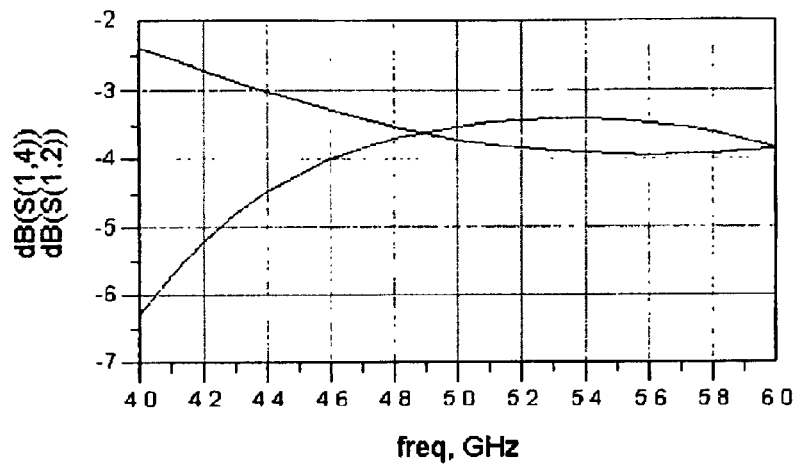
FIG. 9 shows scattering parameters $S_{14}$ and $S_{12}$ of the embodiment of FIG. 4.

FIG. 9 is an illustration of the predicted S scattering parameters for transmission between ports P1 and P4, and ports P1 and P2 of the balun 800. As may be seen from FIG. 5, at the frequency of interest, 5.3 GHz, the scattering parameter is approximately −3 dB, which is required.

Figure 10:
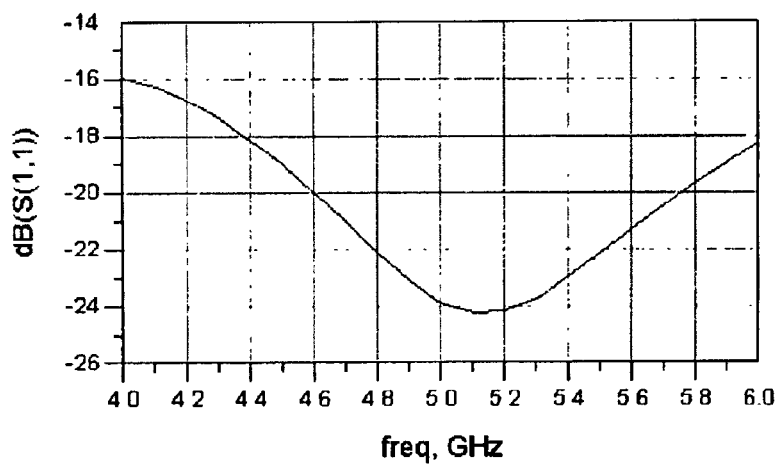
FIG. 10 shows the scattering parameter $S_{11}$ for the embodiment of FIG. 4

FIG. 10 shows a predicted scattering parameter $S_{11}$ that represents whether the balun 800 is properly matched to the transmission characteristics of the printed circuit board. As may be seen from FIG. 10, the scattering parameter $S_{11}$ at all frequencies of interest is substantially less than −20 dB.

Figure 11:
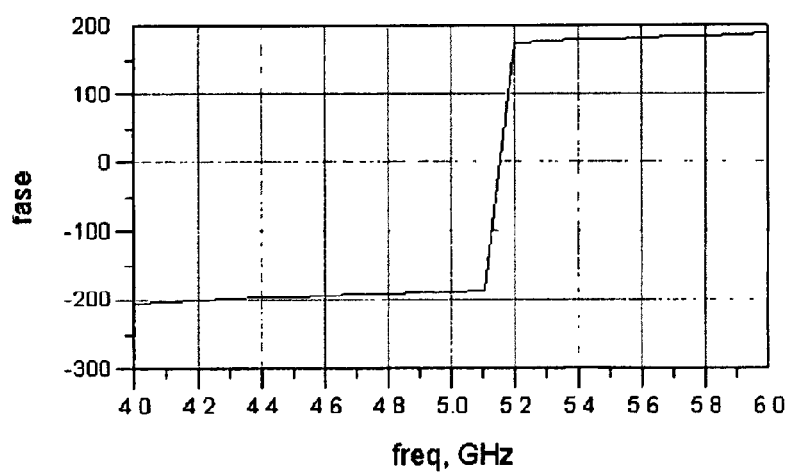
FIG. 11 shows the phase difference for signals passing through the balun of FIG. 8.

FIG. 11 shows a predicted phase response of the balun 400, specifically the phase of the transmitted signal from port P2 to port P1 minus the transmitted signal from port P4 to port P1. As may be seen from FIG. 11, the phase response at 5.3 GHz, the frequency of interest, is −180°.

Figure 13:
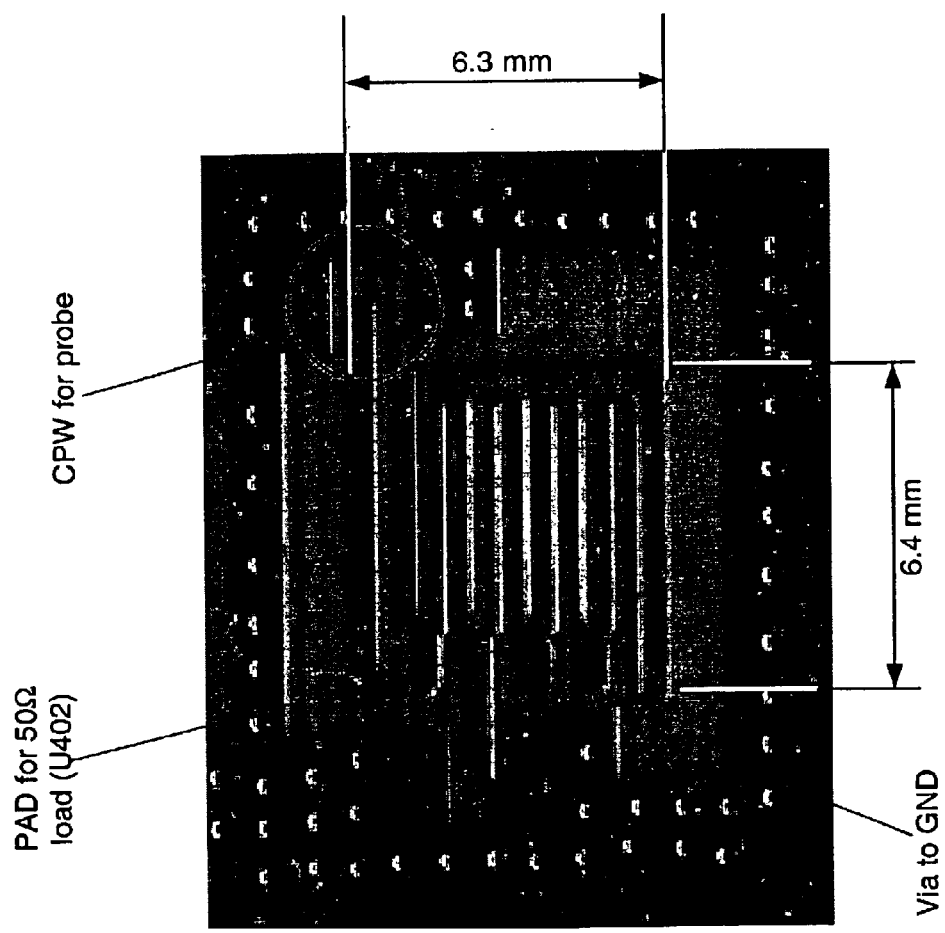
FIG. 13 shows a photograph of an implementation of the balun shown in FIG. 8.

FIG. 13 shows a photograph of an implemented embodiment of FIG. 8, together with exemplary dimensions.

Figure 12:
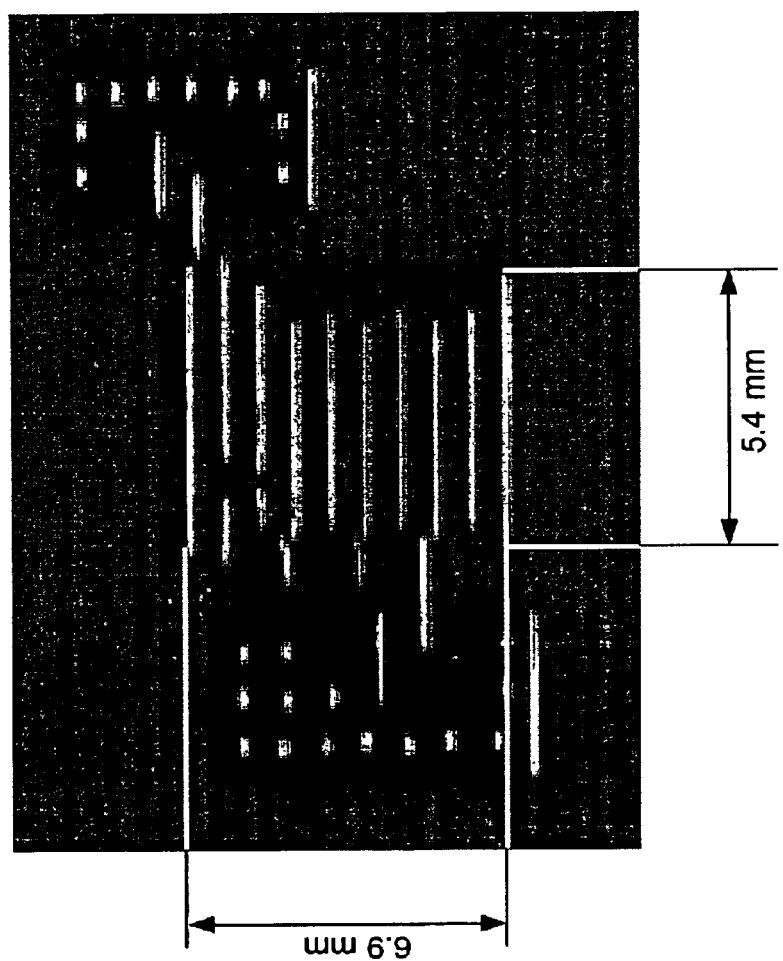
FIG. 12 shows a photograph of an implementation of the 180° hybrid balun of FIG. 4.
Figure 14:
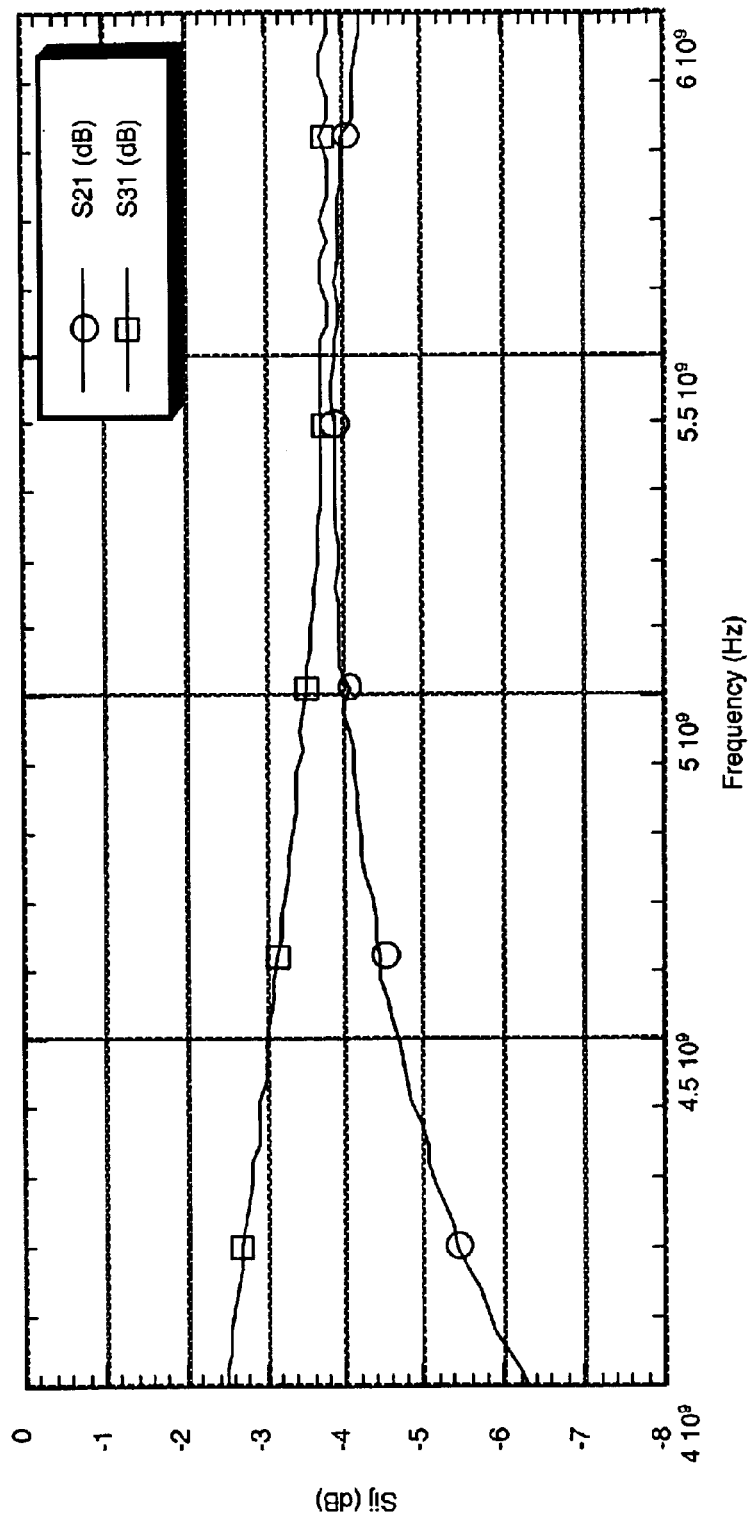
FIG. 14 shows measured scattering parameters $S_{14}$, $S_{12}$ for the balun of FIG. 4.
Figure 15:
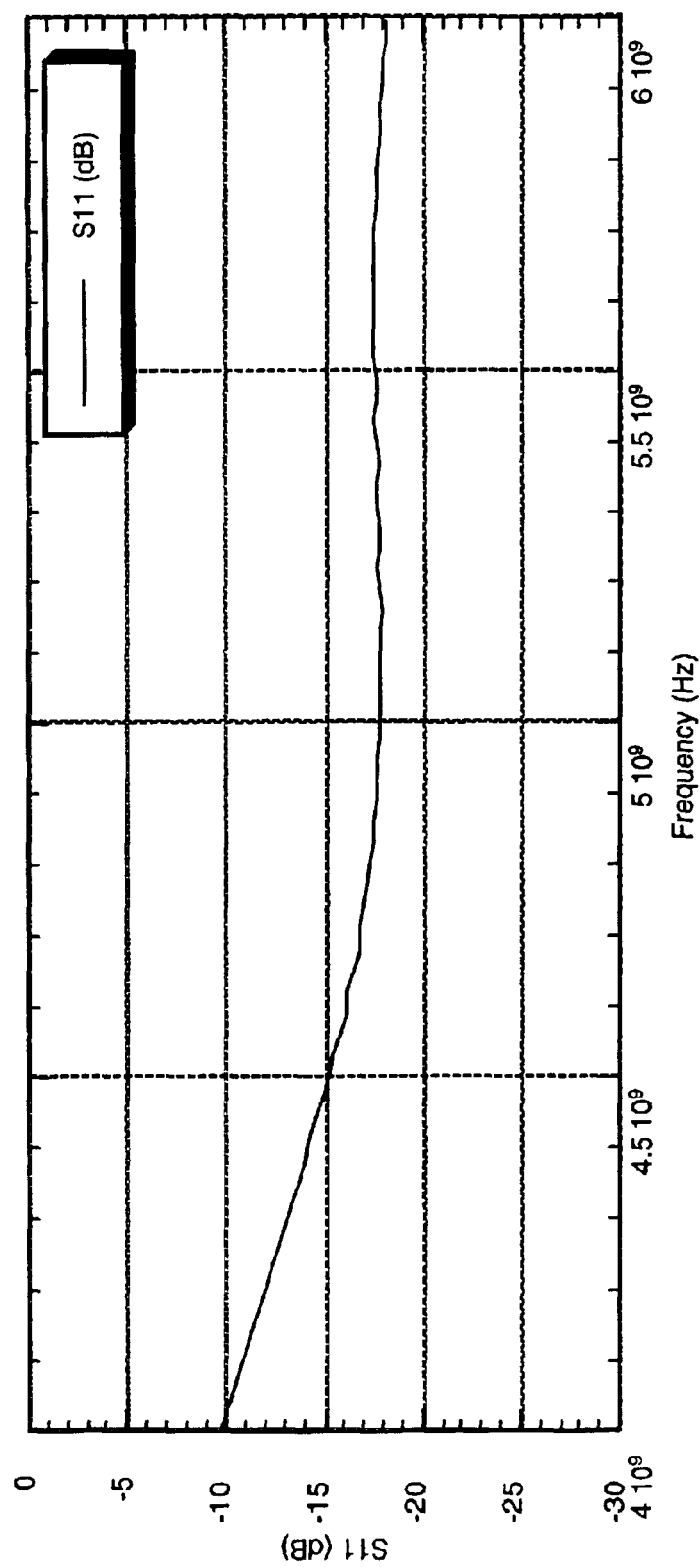
FIG. 15 shows a measured scattering parameter $S_{11}$ for the balun of FIG. 4.
Figure 16:
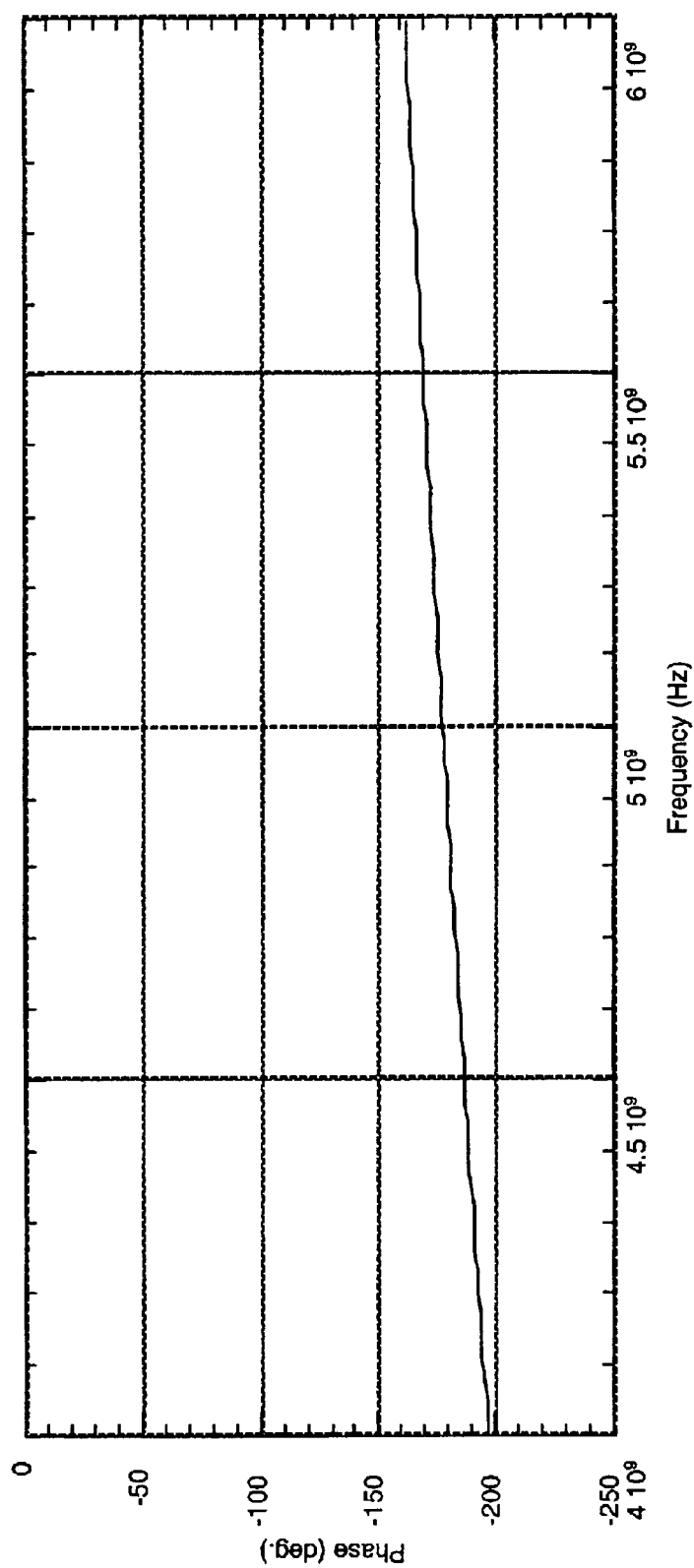
FIG. 16 shows a measured phase response of the balun of FIG. 4.

FIG. 12 shows a photograph of an implemented embodiment of FIG. 4, together with exemplary dimensions, and FIGS. 14, 15 and 16 show measured scattering parameters and phase response for the balun 400 of FIG. 4. As may be seen from these figures, the measured response and the predicted response shown in FIGS. 5, 6 and 7 closely match. Also, although both the embodiments of FIG. 4 and the embodiment of FIG. 8 provide good performance, the performance of the FIG. 4 embodiment is slightly better.

It will be appreciated that the balun of the present invention is applicable to any number of applications that require conversion from single ended to differential signal, and not just to 802.11a applications.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A balancing/unbalancing (balun) structure comprising:
   a microstrip printed circuit board (PCB);
   a first input port and a second input port for coupling to a differential signal;
   an isolated port connected to ground through a resistance;
   an output port for coupling to a single-ended signal corresponding to the differential signal; and
   a plurality of traces on the PCB connecting the two input ports, the isolated port and the output port, wherein distance between at least two adjacent traces is approximately twice PCB thickness, and
   wherein a trace from the first input port to the second input port includes one folded λ/4 element consisting of a single U-shaped trace.

2. The balun structure of claim 1, wherein the first and second input ports and the output port are on opposite sides of the balun structure.

3. The balun structure of claim 1, wherein the first and second input ports and the output port are on the same side of the balun structure.

4. The balun structure of claim 1, wherein the balun structure is a 180° hybrid.

5. The balun structure of claim 1, wherein the balun structure is approximately square in layout.

6. The balun structure of claim 5, wherein a transmission distance from a first input port to the output port is $\lambda/4$, and wherein a trace from the first input port to the output port includes at least one folded $\lambda/4$ element.

7. The balun structure of claim 5, wherein a transmission distance from a the first input port to the second input port is $\lambda/4$.

8. The balun structure of claim 7, wherein a transmission distance from the second input port to the output port is $3\lambda/4$, and wherein a trace from the second input port to the output port includes at least two folded $\lambda/4$ elements.

9. The balun structure of claim 5, wherein distance between all adjacent traces is approximately twice PCB thickness.

10. The balun structure of claim 5, wherein the PCB includes two substrate layers, two tracing layers and a ground layer, and wherein the plurality of traces that comprise the balun are formed on the two tracing layers and are folded over each other.

11. A 180° hybrid balun comprising:

a microstrip line printed circuit board (PCB);

two input ports on one side of the balun for coupling to a differential signal;

an isolated port connected to ground through a resistance;

an output port on an opposite side of the balun for coupling to a single-ended signal corresponding to the differential signal, a direction from the one side to the opposite side defining a horizontal axis; and a plurality of traces on the PCB connecting the two input ports, the isolated port and the output port, wherein the plurality of traces includes a plurality of folded $\lambda/4$ elements oriented along the horizontal axis, and wherein one of the folded $\lambda/4$ elements connects the two input ports and consists of a single U-shaped trace.

12. The 180° hybrid balun of claim 11, wherein a transmission distance from a first input port of the two input ports to the output port is $\lambda/4$, and wherein a trace from the first input port to the output port includes at least one folded $\lambda/4$ element.

13. The 180° hybrid balun of claim 11, wherein a transmission distance from a first input port of the two input ports to a second input port of the two input ports is $\lambda/4$.

14. The 180° hybrid balun of claim 13, wherein a transmission distance from the second input port to the output port is $3\lambda/4$, and wherein a trace from the second input port to the output port includes at least two folded $\lambda/4$ elements.

15. The 180° hybrid balun of claim 11, wherein distance between adjacent traces is approximately twice PCB thickness.

16. The 180° hybrid balun of claim 11, wherein the PCB includes two substrate layers, two tracing layers and a ground layer, and wherein the plurality of traces that comprise the balun are formed on the two tracing layers and are folded over each other.

17. The 180° hybrid balun of claim 11, wherein the 180° hybrid balun is approximately square in layout.

* * * * *

UNITED STATES PATENT AND TRADEMARK OFFICE
CERTIFICATE OF CORRECTION

PATENT NO. : 6,891,448 B2
DATED : May 10, 2005
INVENTOR(S) : Franco De Flaviis

It is certified that error appears in the above-identified patent and that said Letters Patent is hereby corrected as shown below:

Column 7,
Line 2, "a the" should be replaced with -- "the" --.

Signed and Sealed this

Thirtieth Day of August, 2005

JON W. DUDAS
*Director of the United States Patent and Trademark Office*